(12) United States Patent
Pagaila et al.

(10) Patent No.: US 8,063,477 B2
(45) Date of Patent: Nov. 22, 2011

(54) INTEGRATED CIRCUIT PACKAGING SYSTEM HAVING ASYMMETRIC ENCAPSULATION STRUCTURES AND METHOD OF MANUFACTURE THEREOF

(75) Inventors: Reza Argenty Pagaila, Singapore (SG); Byung Tai Do, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 223 days.

(21) Appl. No.: 12/328,762

(22) Filed: Dec. 4, 2008

(65) Prior Publication Data

US 2010/0140770 A1 Jun. 10, 2010

(51) Int. Cl.
*H01L 23/02* (2006.01)
*H01L 23/34* (2006.01)
*H01L 21/44* (2006.01)
*H01L 21/48* (2006.01)
*H01L 21/50* (2006.01)

(52) U.S. Cl. ........ 257/686; 257/777; 257/723; 257/724; 438/109; 438/124; 438/106

(58) Field of Classification Search ................ 257/686, 257/777, 723, 724; 438/109, 64, 106, 112, 438/124, 125, 126, 127
See application file for complete search history.

(56) References Cited

U.S. PATENT DOCUMENTS

| | | | |
|---|---|---|---|
| 6,861,288 B2 * | 3/2005 | Shim et al. | 438/109 |
| 2008/0227238 A1 | 9/2008 | Ko et al. | |
| 2009/0079081 A1 * | 3/2009 | Silverbrook et al. | 257/771 |

\* cited by examiner

*Primary Examiner* — Chuong A. Luu
(74) *Attorney, Agent, or Firm* — Mikio Ishimaru

(57) ABSTRACT

A method of manufacture of an integrated circuit packaging system includes: providing a substrate; mounting a first internal integrated circuit structure and a second internal integrated circuit structure over the substrate; connecting the first internal integrated circuit structure and the second internal integrated circuit structure to the substrate with internal interconnects; forming asymmetric encapsulation structures above the first internal integrated circuit structure and the second internal integrated circuit structure; and encapsulating the first internal integrated circuit structure and the internal interconnects with an encapsulation.

18 Claims, 4 Drawing Sheets

INTEGRATED CIRCUIT PACKAGING SYSTEM HAVING ASYMMETRIC ENCAPSULATION STRUCTURES AND METHOD OF MANUFACTURE THEREOF

TECHNICAL FIELD

The present invention relates generally to integrated circuits and more particularly to a system for utilizing asymmetric encapsulation structures in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these packaging systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting a first internal integrated circuit structure and a second internal integrated circuit structure over the substrate; connecting the first internal integrated circuit structure and the second internal integrated circuit structure to the substrate with internal interconnects; forming asymmetric encapsulation structures above the first internal integrated circuit structure and the second internal integrated circuit structure; and encapsulating the first internal integrated circuit structure and the internal interconnects with an encapsulation.

The present invention provides an integrated circuit packaging system including: a substrate; a first internal integrated circuit structure and a second internal integrated circuit structure mounted over the substrate; internal interconnects connecting the first internal integrated circuit structure and the second internal integrated circuit structure to the substrate; asymmetric encapsulation structures formed above the first internal integrated circuit structure and the second internal integrated circuit structure; and an encapsulation encapsulating the first internal integrated circuit structure and the internal interconnects.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
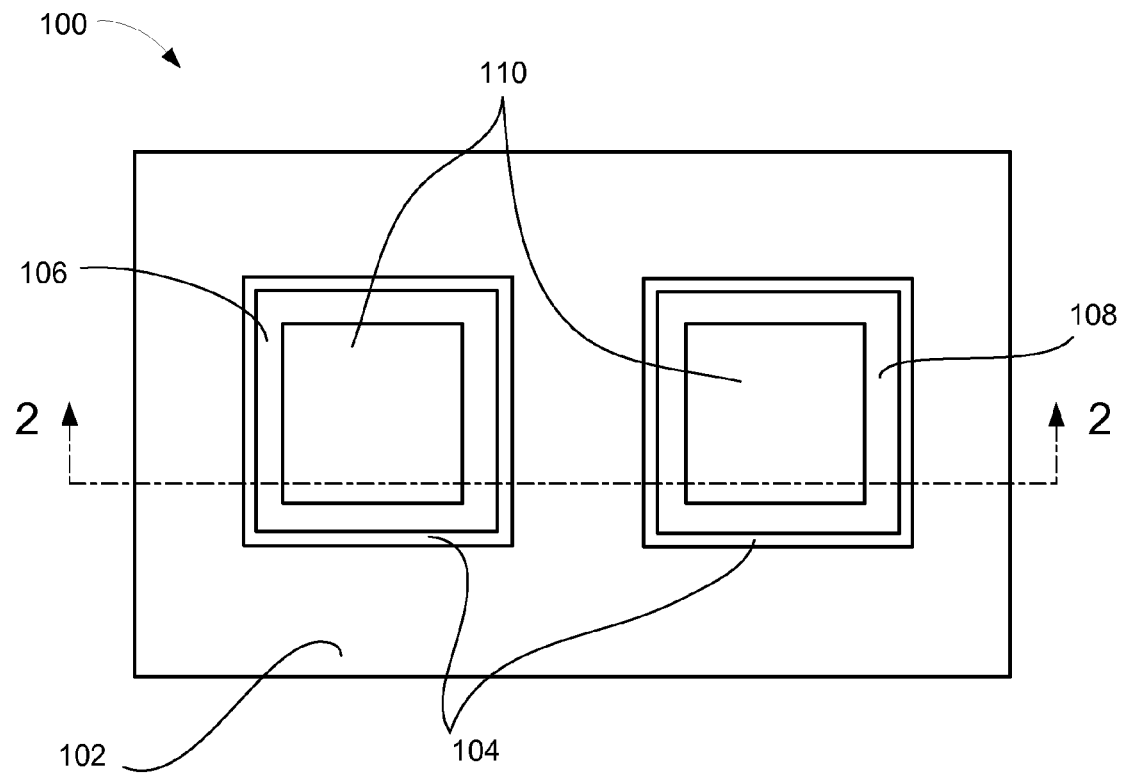
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an encapsulation 102.

The encapsulation 102, such as film assisted molding, protects sensitive components from moisture, dust and other contamination. The encapsulation 102 surrounds asymmetric encapsulation structures 104 such as such as wire-in-film adhesive.

The asymmetric encapsulation structures 104 surround a first interposer 106 and a second interposer 108. The first interposer 106 and the second interposer 108 are exposed from the encapsulation 102.

Mounted above the first interposer 106 and the second interposer 108 are external integrated circuit packages 110.

Figure 2:
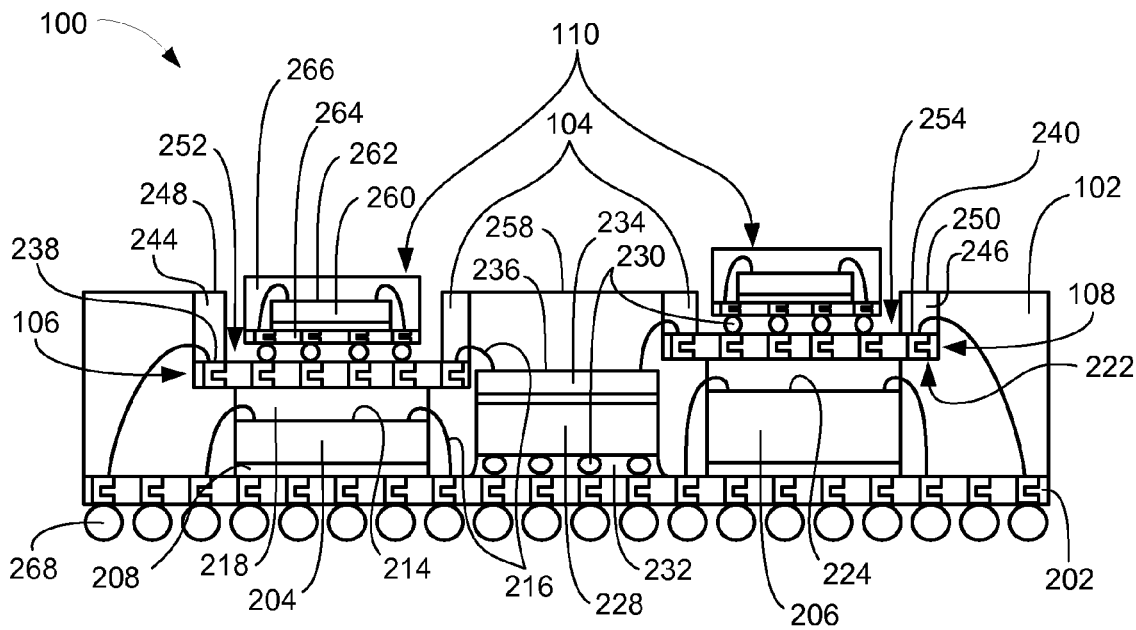
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a laminated plastic or ceramic substrate.

Mounted above the substrate 202 are a first internal integrated circuit structure such as a first internal integrated circuit die 204 and a second internal integrated circuit structure such as a second internal integrated circuit die 206. The first internal integrated circuit die 204 and the second internal integrated circuit die 206 are attached to the substrate 202 with a die attach adhesive 208.

Mounted above the first internal integrated circuit die 204 is the first interposer 106. The first interposer 106 is larger than the first internal integrated circuit die 204 creating an overhang 208 between the first interposer 106 and the substrate 202. The first internal integrated circuit die 204 has an active side 214 connected to the substrate 202 with internal interconnects such as bond wires 216. The first interposer 106 is attached to the first internal integrated circuit die 204 with a wire-in-film adhesive 218.

The wire-in-film adhesive 218 has a low viscosity and, as temperature increases, the viscosity gets lower. Therefore, the wire-in-film adhesive 218 can be easily pressed over the bond wires 216, above, and around the first internal integrated circuit die 204 and then cured to harden the wire-in-film adhesive 218.

It has been discovered that the wire-in-film adhesive 218 should be a thermally conductive dielectric material. The wire-in-film adhesive 218 can be made of a B-stage material that can be hardened after curing and can maintain a predetermined thickness.

Mounted above the second internal integrated circuit die 206 is the second interposer 108. The second interposer 108 is larger than the second internal integrated circuit die 206 creating an overhang 222 between the second interposer 108 and the substrate 202. The second internal integrated circuit die 206 has an active side 224 connected to the substrate 202 the bond wires 216. The second interposer 108 is attached to the second internal integrated circuit die 206 with the wire-in-film adhesive 218.

Mounted above the substrate 202 and between the first internal integrated circuit die 204 and the second internal integrated circuit die 206 is a third internal integrated circuit die 228 such as a flip chip. The third internal integrated circuit die 228 is connected to the substrate 202 with interconnects such as solder ball interconnects 230.

Between the third internal integrated circuit die 228 and the substrate 202 is an under-fill 232. The under-fill 232 increases structural rigidity and helps maintain a strong connection between the third internal integrated circuit die 228 and the substrate 202.

Mounted above the third internal integrated circuit die 228 is a fourth internal integrated circuit die 234 such as a wire-bonded die with an active side 236. The active side 236 of the fourth internal integrated circuit die 234 is connected to the first interposer 106 and the second interposer 108 with the bond wires 216.

In greater detail, the asymmetric encapsulation structures 104 may be a first wire-in-film 244 and a second wire-in-film 246 and are mounted around the bond wires 216 connecting the first interposer 106 and the second interposer 108 to the substrate 202. The first wire-in-film 244 is mounted above the first interposer 106, while the second wire-in-film 246 is mounted over the second interposer 108. The asymmetric encapsulation structures 104 are in peripheral contact with the encapsulation 102 and border an exposed surface 252 and an exposed surface 254. The asymmetric encapsulation structures 104 have vertical edges on the border between the asymmetric encapsulation structures 104 and the exposed surface 252 and exposed surface 254.

In greater detail, the asymmetric encapsulation structures 104 may be a first wire-in-film 244 and a second wire-in-film 246 and are mounted around the bond wires 216 connecting the first interposer 106 and the second interposer 108 to the substrate 202. The first wire-in-film 244 is mounted above the first interposer 106, while the second wire-in-film 246 is mounted over the second interposer 108.

The first wire-in-film 244 has a planar top 248 which is co-planar to a planar top 250 of the second wire-in-film 246. It has been discovered that the planar top 248 of the first wire-in-film 244 and the planar top 250 of the second wire-in-film 246, being co-planar, allow the use of conventional flat panel mold chases that can provide higher yield productivity with lower tooling and design costs.

It has also been discovered that the use of the asymmetric encapsulation structures 104 prevent mold flash, which can contaminate an exposed surface 252 of the first interposer 106 and an exposed surface 254 of the second interposer 108.

The first wire-in-film 244 and the second wire-in-film 246 of the asymmetric encapsulation structures 104 are asymmetric because the top surface 238 of the first interposer 106 is closer to the substrate 202 than the top surface 240 of the second interposer 108. Thus, the second internal integrated circuit die 206 is taller than the first internal integrated circuit die 204 therefore the first wire-in-film 244 is taller than the second wire-in-film 246.

The encapsulation 102 encapsulates the first internal integrated circuit die 204, the second internal integrated circuit die 206, the third internal integrated circuit die 228, and the fourth internal integrated circuit die 234. The encapsulation 102 has a planar top surface 258 that is level with the planar top 248 of the first wire-in-film 244 and the planar top 250 of the second wire-in-film 246.

Mounted to the exposed surface 252 of the first interposer 106 and the exposed surface 254 of the second interposer 108 are the external integrated circuit packages 110. The external integrated circuit packages 110 are connected to the exposed surface 252 of the first interposer 106 and an exposed surface 254 of the second interposer 108 with the solder ball interconnects 230.

The external integrated circuit packages 110 have external integrated circuit package dies 260 such as wire-bonded dies with active sides 262. The active sides 262 of the external integrated circuit package dies 260 are connected to external integrated circuit package substrates 264 with the bond wires 216. The external integrated circuit package dies 260 are attached to the external integrated circuit package substrates 264 with the die attach adhesive 208.

Encapsulating the external integrated circuit package dies 260 are external integrated circuit package encapsulations 266. Mounted below the substrate 202 are external interconnects such as solder balls 268.

Figure 3:
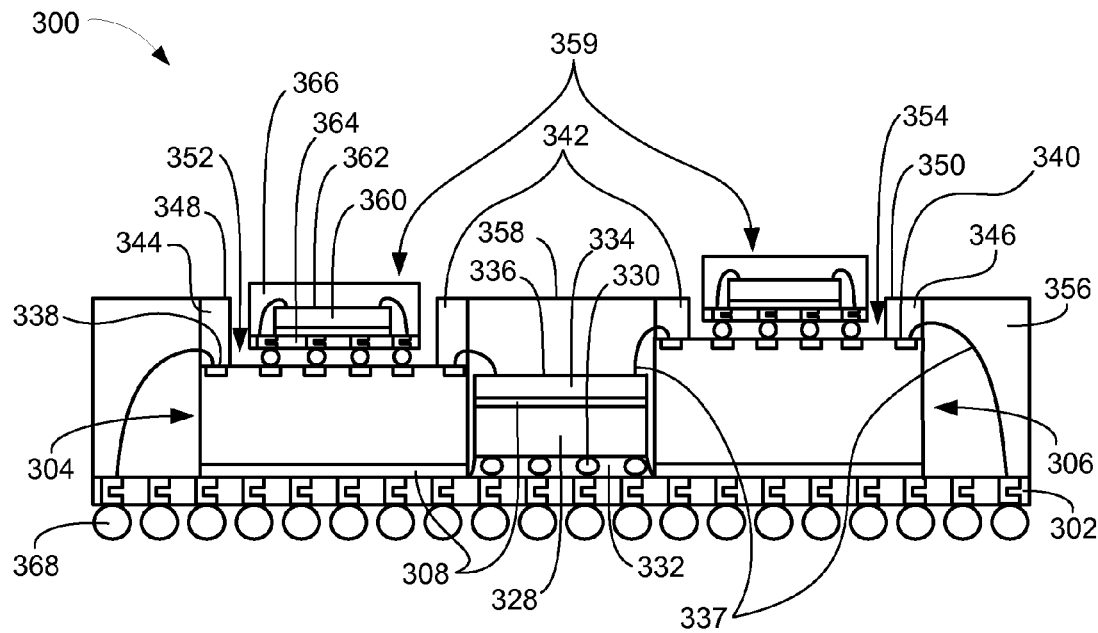
FIG. 3 is a cross-sectional view of an integrated circuit packaging system in a further embodiment of the present invention.

Referring now to FIG. 3, therein is shown a cross-sectional view of an integrated circuit packaging system 300 in a further embodiment of the present invention. The integrated circuit packaging system 300 is shown having a substrate 302 such as a laminated plastic or ceramic substrate.

Mounted above the substrate 302 is a first internal integrated circuit structure such as a first internal integrated circuit die 304 and a second internal integrated circuit structure such as a second internal integrated circuit die 306. The first internal integrated circuit die 304 and the second internal integrated circuit die 306 are attached to the substrate 302 with a die attach adhesive 308.

Mounted above the substrate 302 and between the first internal integrated circuit die 304 and the second internal integrated circuit die 306 is a third internal integrated circuit die 328 such as a flip chip. The third internal integrated circuit die 328 is connected to the substrate 302 with interconnects such as solder ball interconnects 330.

Between the third internal integrated circuit die 328 and the substrate 302 is an under-fill 332. The under-fill 332 increases structural rigidity and helps maintain a strong connection between the third internal integrated circuit die 328 and the substrate 302.

Mounted above the third internal integrated circuit die 328 is a fourth internal integrated circuit die 334 such as a wire-bonded die with an active side 336. The active side 336 of the fourth internal integrated circuit die 334 is connected to the first internal integrated circuit die 304 and the second internal integrated circuit die 306 with such as bond wires 337.

A top surface 338 of the first internal integrated circuit die 304 and a top surface 340 of the second internal integrated circuit die 306 are connected to the substrate 302 with the bond wires 337. Mounted above the first internal integrated circuit die 304 and the second internal integrated circuit die 306 are asymmetric encapsulation structures 342 such as wire-in-film adhesive.

The asymmetric encapsulation structures 342 have a low viscosity and, as temperature increases, the viscosity gets lower. Therefore, the asymmetric encapsulation structures 342 can be easily pressed over the bond wires 337, above, and around the first internal integrated circuit die 304 and the second internal integrated circuit die 306 and then cured to harden the asymmetric encapsulation structures 342.

It has been discovered that the asymmetric encapsulation structures 342 should be a thermally conductive dielectric material. The asymmetric encapsulation structures 342 can be made of a B-stage material that can be hardened after curing and can maintain a predetermined thickness.

In greater detail, the asymmetric encapsulation structures 342 may be a first wire-in-film 344 and a second wire-in-film 346 and are mounted around the bond wires 337 connecting the first internal integrated circuit die 304 and the second internal integrated circuit die 306 to the substrate 302. The first wire-in-film 344 is mounted above the first internal integrated circuit die 304, while the second wire-in-film 346 is mounted over the second internal integrated circuit die 306.

The first wire-in-film 344 has a planar top 348 which is co-planar to a planar top 350 of the second wire-in-film 346. It has been discovered that the planar top 348 of the first wire-in-film 344 and the planar top 350 of the second wire-in-film 346, being co-planar, allow the use of conventional flat panel mold chases that can provide higher yield productivity with lower tooling and design costs.

It has also been discovered that the use of the asymmetric encapsulation structures 342 prevent mold flash, which can contaminate an exposed surface 352 of the first internal integrated circuit die 304 and an exposed surface 354 of the second internal integrated circuit die 306.

The first wire-in-film 344 and the second wire-in-film 346 are asymmetric because the top surface 338 of the first internal integrated circuit die 304 is closer to the substrate 302 than the top surface 340 of the second internal integrated circuit die 306. Thus, the second internal integrated circuit die 306 is taller than the first internal integrated circuit die 304 therefore the first wire-in-film 344 is taller than the second wire-in-film 346.

Encapsulating the first internal integrated circuit die 304, the second internal integrated circuit die 306, the third internal integrated circuit die 328, and the fourth internal integrated circuit die 334 is an encapsulation 356.

The encapsulation 356, such as film assisted molding, protects sensitive components from moisture, dust and other contamination. The encapsulation 356 has a planar top surface 358 that is level with the planar top 348 of the first wire-in-film 344 and the planar top 350 of the second wire-in-film 346.

Mounted to the exposed surface 352 of the first internal integrated circuit die 304 and the exposed surface 354 of the second internal integrated circuit die 306 are external integrated circuit packages 359. The external integrated circuit packages 359 are connected to the exposed surface 352 of the first internal integrated circuit die 304 and an exposed surface 354 of the second internal integrated circuit die 306 with the solder ball interconnects 330.

The external integrated circuit packages 359 have external integrated circuit package dies 360 such as wire-bonded dies with active sides 362. The active sides 362 of the external integrated circuit package dies 360 are connected to external integrated circuit package substrates 364 with the bond wires 337. The external integrated circuit package dies 360 are attached to the external integrated circuit package substrates 364 with the die attach adhesive 308.

Encapsulating the external integrated circuit package dies 360 are external integrated circuit package encapsulations 366. Mounted below the substrate 302 are external interconnects such as solder balls 368.

Figure 4:
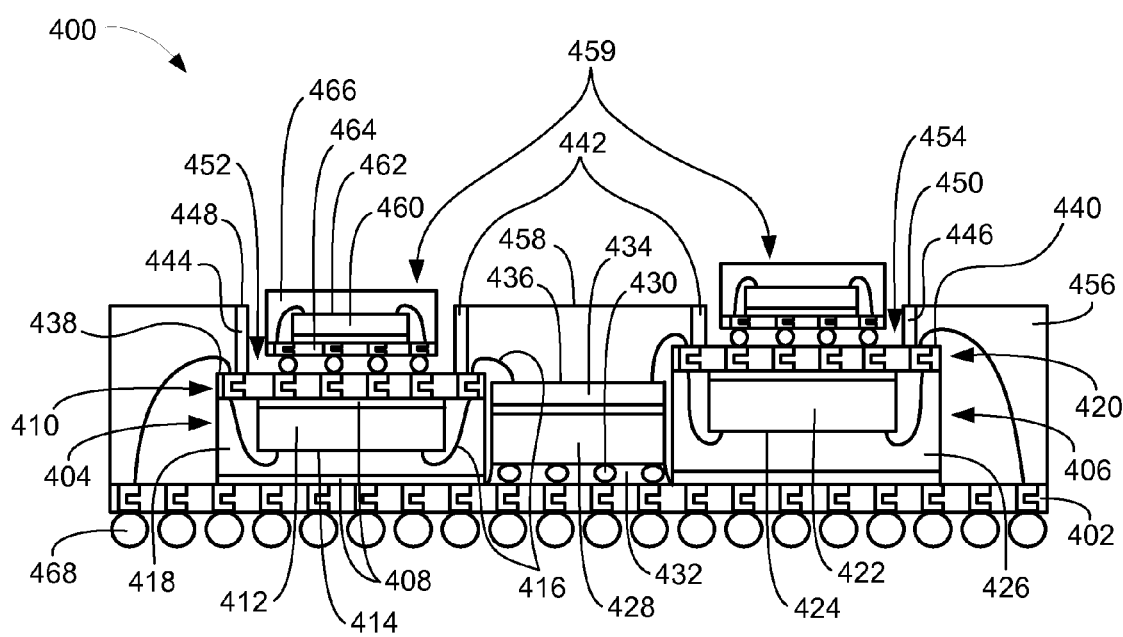
FIG. 4 is a cross-sectional view of an integrated circuit packaging system in a further embodiment of the present invention.

Referring now to FIG. 4, therein is shown a cross-sectional view of an integrated circuit packaging system 400 in a further embodiment of the present invention. The integrated circuit packaging system 400 is shown having a substrate 402 such as a laminated plastic or ceramic substrate.

Mounted above the substrate 402 is a first internal integrated circuit structure such as a first internal integrated circuit package 404 and a second internal integrated circuit structure such as a second internal integrated circuit package 406. The first internal integrated circuit package 404 and the second internal integrated circuit package 406 are attached to the substrate 402 with a die attach adhesive 408.

The first internal integrated circuit package 404 has a first interposer 410 with a first internal integrated circuit package die 412 mounted below and attached with the die attach adhesive 408.

The first internal integrated circuit package die 412 has an active side 414 connected to the first interposer 410 with internal interconnects such as bond wires 416. Below the first interposer 410, the first internal integrated circuit package die 412 is encapsulated with a first internal integrated circuit package encapsulation 418.

The second internal integrated circuit package 406 has a second interposer 420 with a second internal integrated circuit package die 422 mounted below and attached with the die attach adhesive 408.

The second internal integrated circuit package die 422 has an active side 424 connected to the second interposer 420 with the bond wires 416. Below the second interposer 420, the second internal integrated circuit package die 422 is encapsulated with a second internal integrated circuit structure such as a second internal integrated circuit package encapsulation 426.

Mounted above the substrate 402 and between the first internal integrated circuit package 404 and the second internal integrated circuit package 406 is a first internal integrated circuit 428 such as a flip chip. The first internal integrated circuit 428 is connected to the substrate 402 with interconnects such as solder ball interconnects 430.

Between the first internal integrated circuit 428 and the substrate 402 is an under-fill 432. The under-fill 432 increases structural rigidity and helps maintain a strong connection between the first internal integrated circuit 428 and the substrate 402.

Mounted above the first internal integrated circuit 428 is a second internal integrated circuit 434 such as a wire-bonded die with an active side 436. The active side 436 of the second internal integrated circuit 434 is connected to the first interposer 410 and the second interposer 420 with the bond wires 416.

A top surface 438 of the first interposer 410 and a top surface 440 of the second interposer 420 are connected to the substrate 402 with the bond wires 416. Mounted above the first interposer 410 and the second interposer 420 are asymmetric encapsulation structures 442 such as a b-stage curable insulating material or a non-conductive epoxy.

In greater detail, the asymmetric encapsulation structures 442 may be a first dam 444 and a second dam 446 and are mounted beside the bond wires 416 connecting the first interposer 410 and the second interposer 420 to the substrate 402. The first dam 444 is mounted above the first interposer 410, while the second dam 446 is mounted over the second interposer 420.

The first dam 444 has a planar top 448 which is co-planar to a planar top 450 of the second dam 446. It has been discovered that the planar top 448 of the first dam 444 and the planar top 450 of the second dam 446, being co-planar, allow the use of conventional flat panel mold chases that can provide higher yield productivity with lower tooling and design costs.

It has also been discovered that the use of the asymmetric encapsulation structures 442 prevent mold flash, which can contaminate an exposed surface 452 of the first interposer 410 and an exposed surface 454 of the second interposer 420.

The first dam 444 and the second dam 446 are asymmetric because the top surface 438 of the first interposer 410 is closer to the substrate 402 than the top surface 440 of the second interposer 420. Thus, the second internal integrated circuit package 406 is taller than the first internal integrated circuit package 404 therefore the first dam 444 is taller than the second dam 446.

Encapsulating the first internal integrated circuit package 404, the second internal integrated circuit package 406, the first internal integrated circuit 428, and the second internal integrated circuit 434 is an encapsulation 456.

The encapsulation 456, such as film assisted molding, protects sensitive components from moisture, dust and other contamination. The encapsulation 456 has a planar top surface 458 that is level with the planar top 448 of the first dam 444 and the planar top 450 of the second dam 446.

Mounted to the exposed surface 452 of the first interposer 410 and the exposed surface 454 of the second interposer 420 are external integrated circuit packages 459. The external integrated circuit packages 459 are connected to the exposed surface 452 of the first interposer 410 and an exposed surface 454 of the second interposer 420 with the solder ball interconnects 430.

The external integrated circuit packages 459 have external integrated circuit package dies 460 such as wire-bonded dies with active sides 462. The active sides 462 of the external integrated circuit package dies 460 are connected to external integrated circuit package substrates 464 with the bond wires 416. The external integrated circuit package dies 460 are attached to the external integrated circuit package substrates 464 with the die attach adhesive 408.

Encapsulating the external integrated circuit package dies 460 are external integrated circuit package encapsulations 466. Mounted below the substrate 402 are external interconnects such as solder balls 468.

Figure 5:
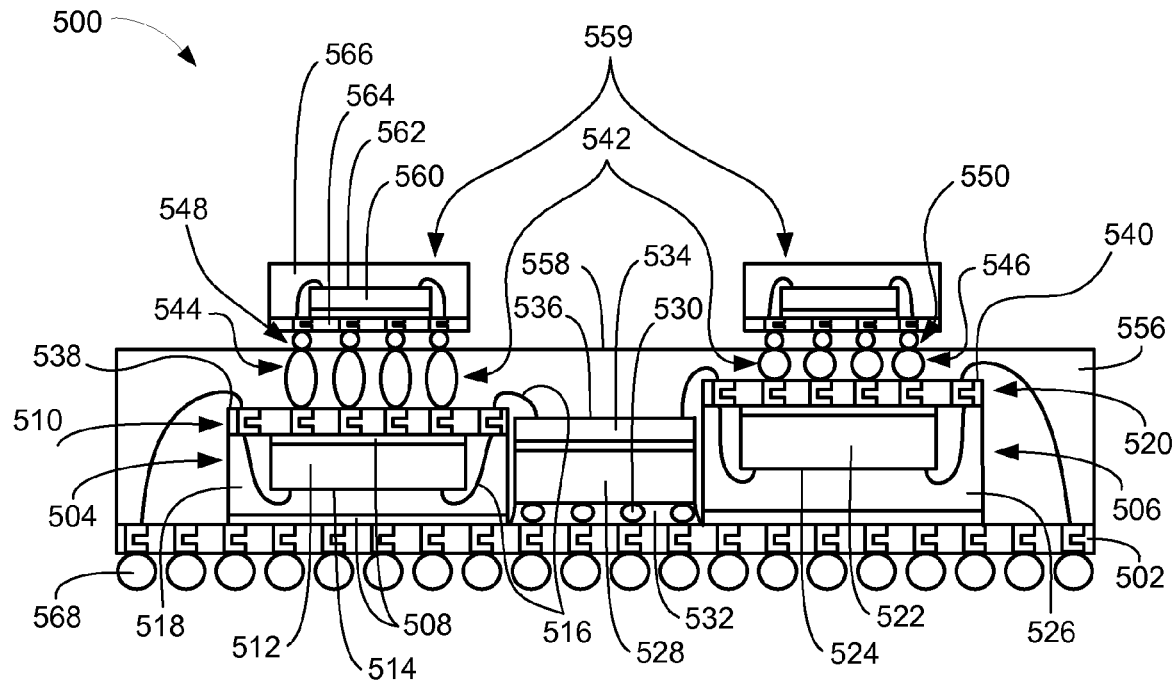
FIG. 5 is a cross-sectional view of an integrated circuit packaging system in a further embodiment of the present invention.

Referring now to FIG. 5, therein is shown a cross-sectional view of an integrated circuit packaging system 500 in a further embodiment of the present invention. The integrated circuit packaging system 500 is shown having a substrate 502 such as a laminated plastic or ceramic substrate.

Mounted above the substrate 502 is a first internal integrated circuit structure such as a first internal integrated circuit package 504 and a second internal integrated circuit structure such as a second internal integrated circuit package 506. The first internal integrated circuit package 504 and the second internal integrated circuit package 506 are attached to the substrate 502 with a die attach adhesive 508.

The first internal integrated circuit package 504 has a first interposer 510 with a first internal integrated circuit package die 512 mounted below and attached with the die attach adhesive 508.

The first internal integrated circuit package die 512 has an active side 514 connected to the first interposer 510 with internal interconnects such as bond wires 516. Below the first interposer 510, the first internal integrated circuit package die 512 is encapsulated with a first internal integrated circuit package encapsulation 518.

The second internal integrated circuit package 506 has a second interposer 520 with a second internal integrated circuit package die 522 mounted below and attached with the die attach adhesive 508.

The second internal integrated circuit package die 522 has an active side 524 connected to the second interposer 520 with the bond wires 516. Below the second interposer 520, the second internal integrated circuit package die 522 is encapsulated with a second internal integrated circuit structure such as a second internal integrated circuit package encapsulation 526.

Mounted above the substrate 502 and between the first internal integrated circuit package 504 and the second internal integrated circuit package 506 is a first internal integrated circuit 528 such as a flip chip. The first internal integrated circuit 528 is connected to the substrate 502 with interconnects such as solder ball interconnects 530.

Between the first internal integrated circuit 528 and the substrate 502 is an under-fill 532. The under-fill 532 increases structural rigidity and helps maintain a strong connection between the first internal integrated circuit 528 and the substrate 502.

Mounted above the first internal integrated circuit 528 is a second internal integrated circuit 534 such as a wire-bonded die with an active side 536. The active side 536 of the second internal integrated circuit 534 is connected to the first interposer 510 and the second interposer 520 with the bond wires 516.

A top surface 538 of the first interposer 510 and a top surface 540 of the second interposer 520 are connected to the substrate 502 with the bond wires 516. Mounted above the first interposer 510 and the second interposer 520 are asymmetric encapsulation structures 542 such as metal pillars.

In greater detail, the asymmetric encapsulation structures 542 may be a first set of metal pillars 544 and a second set of metal pillars 546 and are mounted beside the bond wires 516 connecting the first interposer 510 and the second interposer 520 to the substrate 502. The first set of metal pillars 544 is mounted above the first interposer 510, while the second set of metal pillars 546 is mounted over the second interposer 520.

The first set of metal pillars 544 has a planar top 548 which is co-planar to a planar top 550 of the second set of metal pillars 546. It has been discovered that the planar top 548 of the first set of metal pillars 544 and the planar top 550 of the second set of metal pillars 546, being co-planar, allow the use of conventional flat panel mold chases that can provide higher yield productivity with lower tooling and design costs.

The first set of metal pillars 544 and the second set of metal pillars 546 are asymmetric because the top surface 538 of the first interposer 510 is closer to the substrate 502 than the top surface 540 of the second interposer 520. Thus, the second internal integrated circuit package 506 is taller than the first internal integrated circuit package 504 therefore the first set of metal pillars 544 is taller than the second set of metal pillars 546.

Encapsulating the first internal integrated circuit package 504, the second internal integrated circuit package 506, the first internal integrated circuit 528, and the second internal integrated circuit 534 is an encapsulation 556.

The encapsulation 556, such as film assisted molding, protects sensitive components from moisture, dust and other contamination. The encapsulation 556 has a planar top surface 558 that is level with the planar top 548 of the first set of metal pillars 544 and the planar top 550 of the second set of metal pillars 546.

Mounted to the planar top 548 of the first set of metal pillars 544 and the planar top 550 of the second set of metal pillars 546 are external integrated circuit packages 559. The external integrated circuit packages 559 are connected to the planar top 548 of the first set of metal pillars 544 and the planar top 550 of the second set of metal pillars 546 with the solder ball interconnects 530.

The external integrated circuit packages 559 have external integrated circuit package dies 560 such as wire-bonded dies with active sides 562. The active sides 562 of the external integrated circuit package dies 560 are connected to external integrated circuit package substrates 564 with the bond wires 516. The external integrated circuit package dies 560 are attached to the external integrated circuit package substrates 564 with the die attach adhesive 508.

Encapsulating the external integrated circuit package dies 560 are external integrated circuit package encapsulations 566. Mounted below the substrate 502 are external interconnects such as solder balls 568.

Figure 6:
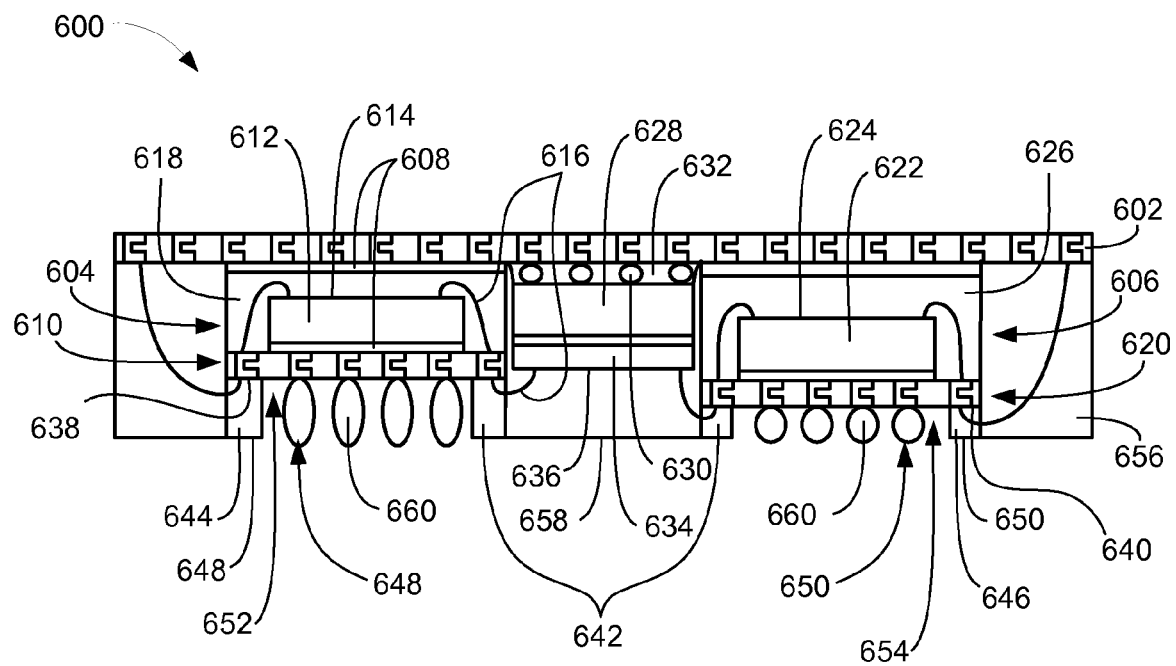
FIG. 6 is a cross-sectional view of an integrated circuit packaging system in a further embodiment of the present invention.

Referring now to FIG. 6, therein is shown a cross-sectional view of an integrated circuit packaging system 600 in a further embodiment of the present invention. The integrated circuit packaging system 600 is shown having a substrate 602 such as a laminated plastic or ceramic substrate.

Mounted below the substrate 602 is a first internal integrated circuit structure such as a first internal integrated circuit package 604 and a second internal integrated circuit structure such as a second internal integrated circuit package 606. The first internal integrated circuit package 604 and the second internal integrated circuit package 606 are attached to the substrate 602 with a die attach adhesive 608.

The first internal integrated circuit package 604 has a first interposer 610 with a first internal integrated circuit package die 612 mounted above and attached with the die attach adhesive 608.

The first internal integrated circuit package die 612 has an active side 614 connected to the first interposer 610 with internal interconnects such as bond wires 616. Above the first interposer 610, the first internal integrated circuit package die 612 is encapsulated with a first internal integrated circuit package encapsulation 618.

The second internal integrated circuit package 606 has a second interposer 620 with a second internal integrated circuit package die 622 mounted above and attached with the die attach adhesive 608.

The second internal integrated circuit package die 622 has an active side 624 connected to the second interposer 620 with the bond wires 616. Above the second interposer 620, the second internal integrated circuit package die 622 is encapsulated with a second internal integrated circuit structure such as a second internal integrated circuit package encapsulation 626.

Mounted below the substrate 602 and between the first internal integrated circuit package 604 and the second internal integrated circuit package 606 is a first internal integrated circuit 628 such as a flip chip. The first internal integrated circuit 628 is connected to the substrate 602 with interconnects such as solder ball interconnects 630.

Between the first internal integrated circuit 628 and the substrate 602 is an under-fill 632. The under-fill 632 increases structural rigidity and helps maintain a strong connection between the first internal integrated circuit 628 and the substrate 602.

Mounted below the first internal integrated circuit 628 is a second internal integrated circuit 634 such as a wire-bonded die with an active side 636. The active side 636 of the second internal integrated circuit 634 is connected to the first interposer 610 and the second interposer 620 with the bond wires 616.

A bottom surface 638 of the first interposer 610 and a bottom surface 640 of the second interposer 620 are connected to the substrate 602 with the bond wires 616. Mounted below the first interposer 610 and the second interposer 620 are asymmetric encapsulation structures 642 such as wire-in-film adhesive.

In greater detail, the asymmetric encapsulation structures 642 may be a first wire-in-film 644 and a second wire-in-film 646 and are mounted around the bond wires 616 connecting the first interposer 610 and the second interposer 620 to the substrate 602. The first wire-in-film 644 is mounted below the first interposer 610, while the second wire-in-film 646 is mounted under the second interposer 620.

The first wire-in-film 644 has a planar bottom 648 which is co-planar to a planar bottom 650 of the second wire-in-film 646. It has been discovered that the planar bottom 648 of the first wire-in-film 644 and the planar bottom 650 of the second wire-in-film 646, being co-planar, allow the use of conventional flat panel mold chases that can provide higher yield productivity with lower tooling and design costs.

It has also been discovered that the use of the asymmetric encapsulation structures 642 prevent mold flash, which can contaminate an exposed surface 652 of the first interposer 610 and an exposed surface 654 of the second interposer 620.

The first wire-in-film 644 and the second wire-in-film 646 are asymmetric because the bottom surface 638 of the first interposer 610 is closer to the substrate 602 than the bottom surface 640 of the second interposer 620. Thus, the second internal integrated circuit package 606 is taller than the first internal integrated circuit package 604 therefore the first wire-in-film 644 is taller than the second wire-in-film 646.

Encapsulating the first internal integrated circuit package 604, the second internal integrated circuit package 606, the first internal integrated circuit 628, and the second internal integrated circuit 634 is an encapsulation 656.

The encapsulation 656, such as film assisted molding, protects sensitive components from moisture, dust and other contamination. The encapsulation 656 has a planar bottom surface 658 that is level with the planar bottom 648 of the first wire-in-film 644 and the planar bottom 650 of the second wire-in-film 646.

Mounted to the exposed surface 652 of the first interposer 610 and the exposed surface 654 of the second interposer 620 are metal pillars 660. The metal pillars 660 mounted to the first interposer 610 are similar in height to the first wire-in-film 644, while the metal pillars 660 mounted to the second interposer 620 are similar in height to the second wire-in-film 646.

Figure 7:
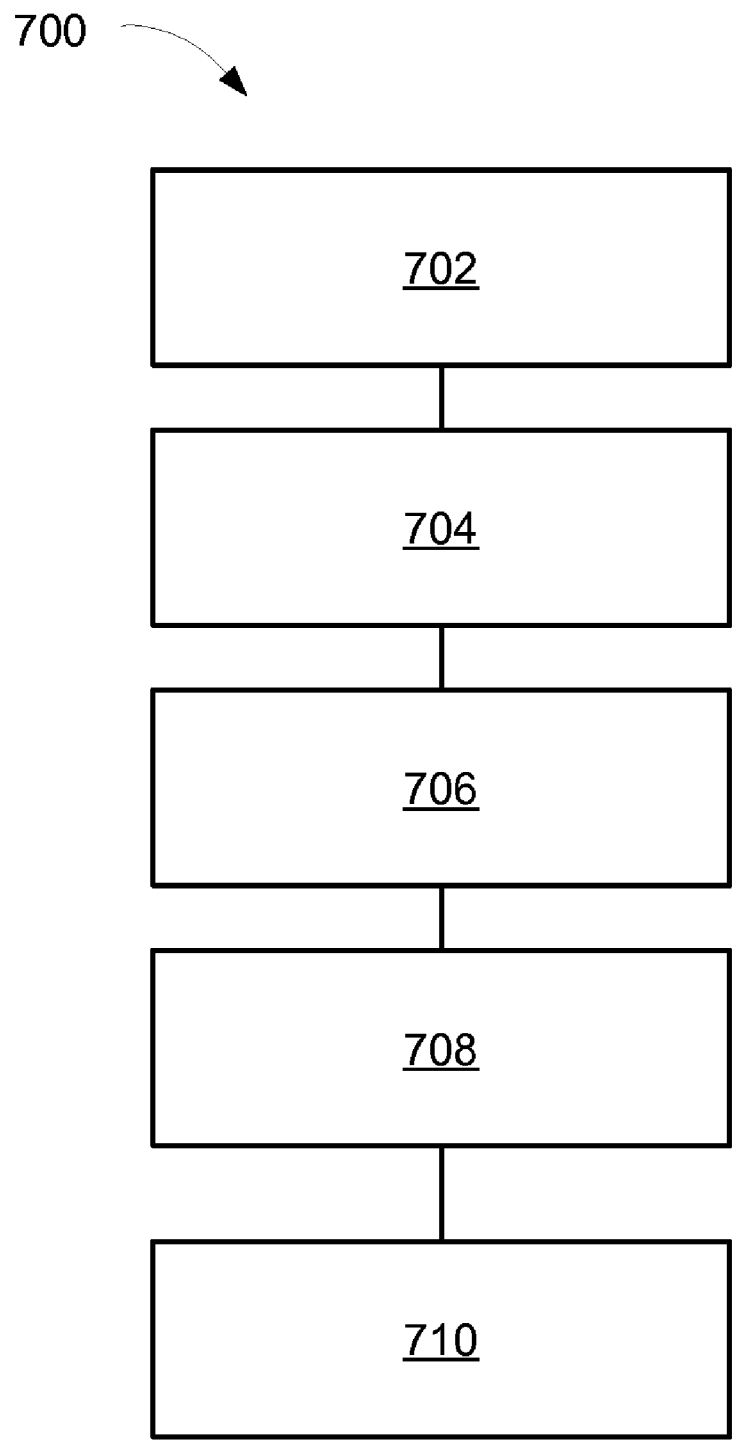
FIG. 7 is a flow chart of a method of manufacture of an integrated circuit packaging system of FIG. 1 in a further embodiment of the present invention.

Referring now to FIG. 7, therein is shown a flow chart of a method 700 of manufacture of the integrated circuit packaging system 100 of FIG. 1 in a further embodiment of the present invention. The method 700 includes providing a substrate in a block 702; mounting a first internal integrated circuit structure and a second internal integrated circuit structure over the substrate in a block 704; connecting the first internal integrated circuit structure and the second internal integrated circuit structure to the substrate with internal interconnects in a block 706; forming asymmetric encapsulation structures above the first internal integrated circuit structure and the second internal integrated circuit structure in a block 708; and encapsulating the first internal integrated circuit structure and the internal interconnects with an encapsulation in a block 710.

It has been discovered that the present invention thus has numerous aspects.

A principle aspect that has been unexpectedly discovered is that the present invention allows the use of conventional flat panel mold chases that can provide higher yield productivity with lower tooling and design costs.

Another aspect is the use of the asymmetric encapsulation structures prevent mold flash, which can contaminate an exposed surface.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the asymmetric encapsulation structure system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   providing a substrate;
   mounting a first internal integrated circuit structure and a second internal integrated circuit structure over the substrate;
   connecting the first internal integrated circuit structure and the second internal integrated circuit structure to the substrate with internal interconnects;
   forming asymmetric encapsulation structures above the first internal integrated circuit structure and the second internal integrated circuit structure;

encapsulating the first internal integrated circuit structure and the internal interconnects with an encapsulation in contact with the asymmetric encapsulation structures; and mounting an external integrated circuit package above the first internal integrated circuit structure, the second internal integrated circuit structure, or a combination thereof.

2. The method as claimed in claim 1 wherein:

forming the asymmetric encapsulation structures includes forming a first wire-in-film with a planar top above the first internal integrated circuit structure and a second wire-in-film with a planar top, or forming a first dam with a planar top and a second dam with a planar top above the second internal integrated circuit structure; and encapsulating includes encapsulating with the encapsulation having a planar top, and the planar top of the encapsulation is level with the planar top of the first wire-in-film and the planar top of the second wire-in-film, or level with the planar top of the first dam and with the planar top of the second dam.

3. The method as claimed in claim 1 wherein:

forming the asymmetric encapsulation structures includes forming a first wire-in-film or a second wire-in-film around the internal interconnects, forming a first dam or a second dam beside the internal interconnects, or a combination thereof.

4. The method as claimed in claim 1 wherein:

mounting the first internal integrated circuit structure includes mounting a first internal integrated circuit die; and further comprising:

mounting a first interposer above the first internal integrated circuit die.

5. A method of manufacture of an integrated circuit packaging system comprising:

providing a substrate;

mounting a first internal integrated circuit structure and a second internal integrated circuit structure over the substrate;

connecting the first internal integrated circuit structure and the second internal integrated circuit structure to the substrate with internal interconnects;

mounting a first internal integrated circuit die between the first internal integrated circuit structure and the second internal integrated circuit structure and mounted over the substrate;

forming asymmetric encapsulation structures above the first internal integrated circuit structure and the second internal integrated circuit structure;

encapsulating the first internal integrated circuit structure, the first internal integrated circuit die, and the internal interconnects with an encapsulation in contact with the asymmetric encapsulation structures; and mounting an external integrated circuit package above the first internal integrated circuit structure, the second internal integrated circuit structure, or a combination thereof.

6. The method as claimed in claim 5 wherein:

forming the asymmetric encapsulation structures includes forming first set of metal pillars and a second set of metal pillars.

7. The method as claimed in claim 5 wherein:

forming the asymmetric encapsulation structures includes forming a first wire-in-film with a planar top, or a first dam with a planar top above the first internal integrated circuit structure and forming a second wire-in-film with a planar top, or a second dam with a planar top above the second internal integrated circuit structure; and encapsulating includes creating an exposed surface above the first internal integrated circuit structure and an exposed surface above the second internal integrated circuit structure.

8. The method as claimed in claim 5 further comprising:

mounting a second internal integrated circuit die above the first internal integrated circuit die.

9. The method as claimed in claim 5 wherein:

forming the asymmetric encapsulation structures includes forming a first wire-in-film with a planar top, or a first dam with a planar top above the first internal integrated circuit structure and forming a second wire-in-film with a planar top, or a second dam with a planar top above the second internal integrated circuit structure;

encapsulating includes creating an exposed surface above the first internal integrated circuit structure and an exposed surface above the second internal integrated circuit structure; and further comprising:

mounting metal pillars below the first internal integrated circuit structure and the second internal integrated circuit structure.

10. An integrated circuit packaging system comprising:

a substrate;

a first internal integrated circuit structure and a second internal integrated circuit structure mounted over the substrate;

internal interconnects connecting the first internal integrated circuit structure and the second internal integrated circuit structure to the substrate;

asymmetric encapsulation structures formed above the first internal integrated circuit structure and the second internal integrated circuit structure;

an encapsulation in contact with the asymmetric encapsulation structures, with the encapsulation encapsulating the first internal integrated circuit structure and the internal interconnects; and an external integrated circuit package mounted above the first internal integrated circuit structure, the second internal integrated circuit structure, or a combination thereof.

11. The system as claimed in claim 10 wherein:

the asymmetric encapsulation structures are a first wire-in-film with a planar top above the first internal integrated circuit structure and a second wire-in-film with a planar top, or the asymmetric encapsulation structures are a first dam with a planar top and a second dam with a planar top above the second internal integrated circuit structure; and the encapsulation has a planar top, and the planar top of the encapsulation is level with the planar top of the first wire-in-film and the planar top of the second wire-in-film, or level with the planar top of the first dam and with the planar top of the second dam.

12. The system as claimed in claim 10 wherein:

the asymmetric encapsulation structures are a first wire-in-film or a second wire-in-film around the internal interconnects, the asymmetric encapsulation structures are a first dam or a second dam beside the internal interconnects, or a combination thereof.

13. The system as claimed in claim 10 wherein:

the first internal integrated circuit structure is a first internal integrated circuit die; and further comprising:

a first interposer mounted above the first internal integrated circuit die.

14. The system as claimed in claim 10 further comprising:
a first internal integrated circuit die mounted between the first internal integrated circuit structure and the second internal integrated circuit structure and mounted over the substrate; and
wherein;
the first internal integrated circuit die, and the internal interconnects are encapsulated with the encapsulation.

15. The system as claimed in claim 14 wherein:
the asymmetric encapsulation structures are a first set of metal pillars and a second set of metal pillars.

16. The system as claimed in claim 14 wherein:
the asymmetric encapsulation structures are a first wire-in-film with a planar top, or a first dam with a planar top above the first internal integrated circuit structure and the asymmetric encapsulation structures are a second wire-in-film with a planar top, or a second dam with a planar top above the second internal integrated circuit structure; and
further comprising:
an exposed surface created above the first internal integrated circuit structure and an exposed surface created above the second internal integrated circuit structure.

17. The system as claimed in claim 14 further comprising:
a second internal integrated circuit die mounted above the first internal integrated circuit die.

18. The system as claimed in claim 14 wherein:
the asymmetric encapsulation structures are a first wire-in-film with a planar top, or a first dam with a planar top above the first internal integrated circuit structure and the asymmetric encapsulation structures are a second wire-in-film with a planar top, or a second dam with a planar top above the second internal integrated circuit structure;
further comprising:
an exposed surface created above the first internal integrated circuit structure and an exposed surface created above the second internal integrated circuit structure; and
metal pillars mounted below the first internal integrated circuit structure and the second internal integrated circuit structure.

* * * * *

UNITED STATES PATENT AND TRADEMARK OFFICE
CERTIFICATE OF CORRECTION

PATENT NO. : 8,063,477 B2
APPLICATION NO. : 12/328762
DATED : November 22, 2011
INVENTOR(S) : Pagaila et al.

It is certified that error appears in the above-identified patent and that said Letters Patent is hereby corrected as shown below:

In the Specification:

Column 4, lines 49-50, [Para 40] was inadvertently omitted, insert therefor --A top surface 238 of the first interposer 106 and a top surface 240 of the second interposer 108 are connected to the substrate 202 with the bond wires 216. The asymmetric encapsulation structures 104 such the wire-in-film adhesive is mounted above the first interposer 106 and the second interposer 108.--

Column 4, line 63 to Column 5, line 2, delete "In greater detail, the asymmetric encapsulation structures 104 may be a first wire-infilm 244 and a second wire-in-film 246 and are mounted around the bond wires 216 connecting the first interposer 106 and the second interposer 108 to the substrate 202. The first wire-in-film 244 is mounted above the first interposer 106, while the second wire-in-film 246 is mounted over the second interposer 108."

Signed and Sealed this
Eighteenth Day of February, 2014

Michelle K. Lee
*Deputy Director of the United States Patent and Trademark Office*